(12) United States Patent
Hsu et al.

(10) Patent No.: US 10,475,765 B2
(45) Date of Patent: Nov. 12, 2019

(54) INTERPOSER SUBSTRATE AND METHOD FOR MANUFACTURING THE SAME

(71) Applicant: PHOENIX PIONEER TECHNOLOGY CO., LTD., Hsinchu County (TW)

(72) Inventors: Shih-Ping Hsu, Hsinchu County (TW); Che-Wei Hsu, Hsinchu County (TW); Ching-Chieh Chang, Hsinchu County (TW); Chao-Chung Tseng, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/817,450

(22) Filed: Nov. 20, 2017

(65) Prior Publication Data

US 2019/0074260 A1    Mar. 7, 2019

(30) Foreign Application Priority Data

Sep. 5, 2017    (TW) .............................. 106130289 A

(51) Int. Cl.
*H01L 23/00*    (2006.01)
*H01L 23/498*    (2006.01)

(52) U.S. Cl.
CPC ............ *H01L 24/97* (2013.01); *H01L 23/498* (2013.01); *H01L 24/42* (2013.01); *H01L 24/08* (2013.01); *H01L 24/16* (2013.01); *H01L 24/48* (2013.01); *H01L 2224/08225* (2013.01); *H01L 2224/16227* (2013.01); *H01L 2224/48227* (2013.01); *H01L 2224/73265* (2013.01); *H01L 2224/80904* (2013.01); *H01L 2924/051* (2013.01); *H01L 2924/181* (2013.01); *H01L 2924/351* (2013.01)

(58) Field of Classification Search
CPC ..................... H01L 24/97; H01L 24/42; H01L 2224/48227; H01L 2224/73265; H01L 2924/051; H01L 2924/181; H01L 2924/351
USPC ....................................... 257/686
See application file for complete search history.

(56) References Cited

U.S. PATENT DOCUMENTS

| | | | | |
|---|---|---|---|---|
| 2009/0079065 A1* | 3/2009 | Furgut | ................ | H01L 23/3121 257/724 |
| 2013/0015582 A1* | 1/2013 | Kondo | .............. | H01L 23/49816 257/772 |
| 2013/0337608 A1* | 12/2013 | Kotani | ................. | H01L 21/561 438/110 |
| 2014/0121293 A1* | 5/2014 | Nakamura | ............. | C08G 75/08 522/168 |
| 2017/0338174 A1* | 11/2017 | Hu | .................... | H01L 23/49838 |

* cited by examiner

*Primary Examiner* — Tong-Ho Kim
(74) *Attorney, Agent, or Firm* — Amin, Turocy & Watson LLP

(57) ABSTRACT

The disclosure provides an interposer substrate and a method for manufacturing the same. The method includes forming an insulating protection layer having a phosphorus compound on a substrate body, thereby providing toughness and strength as required when the thickness of the interposer substrate becomes too thin, and preventing substrate warpage when the substrate has a shrinkage stress or structural asymmetries.

8 Claims, 4 Drawing Sheets

INTERPOSER SUBSTRATE AND METHOD FOR MANUFACTURING THE SAME

BACKGROUND

1. Technical Field

The present disclosure relates to interposer substrates, and, more particularly, to an interposer substrate suitable for a packaging process and a method for manufacturing the same.

2. Description of Related Art

Early packaging stack structure involves stacking a memory package (commonly known as a memory IC) on a logic package (commonly known as a logic IC) via a plurality of solder balls. With the rising demands for more compact and multi-functional electronic products, the wiring density of the memory package is getting higher, often down to the nanometer scale, so the spacing between contacts is increasingly becoming smaller. However, the spacing of the logic package is usually in the scale of microns. As a result, despite having a memory package of high line density, there is no logical package of the equivalent density that can be used to effectively produce an electronic product.

In view of the above problem, an interposer substrate is added between the memory package and the logic package. The bottom of the interposer substrate is electrically connected with the logic package having a logic chip with a larger spacing, while the top of the interposer substrate is electrically connected with the memory package having a memory chip with a smaller spacing.

FIG. 1 is a cross-sectional diagram depicting a method for manufacturing a conventional interposer substrate 1. A substrate body 10 overlaid with an insulating protection layer 11 is provided. The substrate body 10 includes at least one dielectric layer 10b and wiring layers disposed on the dielectric layer (only the wiring layer 10a on the outermost surface is shown). The wiring layer 10a includes a plurality of conductive wires 101 and a plurality of conductive pads 100 connected with the conductive wires 101. The insulating protection layer 11 can act as a green solder mask and may include a plurality of openings 110 to expose portions of the surfaces of the conductive pads 100.

However, as the insulating protection layer 11 is made of green paint into which rigid filler materials are often added, such as ceramic powder (e.g., alumina, barium carbonate, etc.), so as to increase structural strength, when the interposer substrate 1 is thinned to a certain level (e.g., below 180 μm), its toughness decreases. As a result, substrate warpage may occur when the interposer substrate 1 has shrinkage stress or structural asymmetries. The thinned interposer substrate 1 (with a thickness H less than 180 μm) therefore cannot meet the requirement for stress variations.

Moreover, a tough polyimide (PI) thin film or other flexible materials are then proposed as the material for the insulating protection layer 11 in order to meet the requirement for stress variations. However, polyimide has neither stickiness nor rigidity, so a tape 11a is needed to adhere it on the dielectric layer 10b of the substrate body 10. This causes the thickness H of the interposer substrate 1 to exceed 180 μm, resulting in failing to meet the requirement for thin interposer substrates.

Furthermore, another method is proposed for forming the insulating protection layer 11 on the dielectric layer 10b of the substrate body 10 by coating and subsequently curing a liquid solder mask. However, this manufacturing process is complicated, and uneven coating often occurs, resulting in low reliability of the interposer substrate 1.

Therefore, there is a need for a solution that addresses the aforementioned issues in the prior art.

SUMMARY

In view of the aforementioned shortcomings of the prior art, the present disclosure provides an interposer substrate, which may include: a substrate body including at least one insulating layer and a wiring portion combined with the insulating layer, the wiring portion including a wiring layer formed on the insulating layer and a plurality of conductive posts disposed in the insulating layer and electrically connected to the wiring layers; and an insulating protection layer formed on the substrate body and including a phosphorous compound.

The present disclosure further provides a method for manufacturing an interposer substrate, which may include: providing a substrate body including at least one insulating layer and a wiring portion combined with the insulating layer, the wiring portion including a wiring layer formed on the insulating layer and a plurality of conductive posts disposed in the insulating layer and electrically connected to the wiring layers; and forming on the substrate body an insulating protection layer including a phosphorous compound.

In an embodiment, the insulating layer is made of a molding compound or a primer.

In an embodiment, the coefficient of thermal expansion (CTE) of the insulating protection layer is greater than the CTE of the insulating layer.

In an embodiment, the phosphorous compound contains phosphorous in a range of from 10000 to 30000 ppm.

In an embodiment, the total thickness of the substrate body and the insulating protection layer is less than or equal to 180 μm.

From the above, it is clear that the interposer substrate and the method for manufacturing the same according to the present disclosure increase toughness by incorporating a phosphorus compound into the insulating protection layer, so that the insulating protection layer can be a thin film made of a tacky material with good structural strength without the need for a tape. As such, even when the thickness of the interposer substrate is small, the insulating protection layer having the phosphorus compound can still be able to provide the toughness the interposer substrate needs. Moreover, when shrinkage stress or structural asymmetry occurs, substrate warpage can be prevented. Compared to existing prior art, the interposer substrate according to the present disclosure satisfies both the need for thinning and the requirement for stress variations.

BRIEF DESCRIPTION OF THE DRAWINGS

FIG. 2F-1 is another implementation of FIG. 2F;

DETAILED DESCRIPTION OF THE EMBODIMENTS

Figure 1:
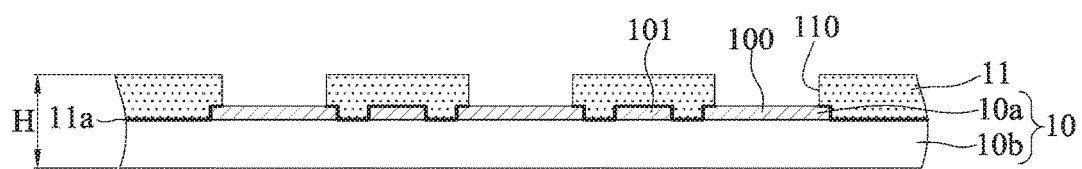
FIG. 1 is a cross-sectional diagram depicting a method for manufacturing a conventional interposer substrate.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "below", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2F are cross-sectional diagrams illustrating a method for manufacturing a coreless interposer substrate 2 in accordance with a first embodiment of the present disclosure. In an embodiment, the interposer substrate 2 is suitable as a carrier for a flip-chip scale package (FCCSP).

Figure 2A:
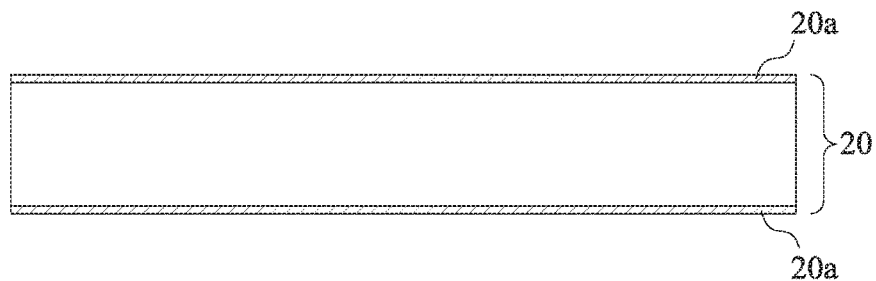
FIGS. 2A to 2F are cross-sectional diagrams illustrating a method for manufacturing an interposer substrate in accordance with a first embodiment of the present disclosure.

As shown in FIG. 2A, a base 20 is provided. In an embodiment, the base 20 is a substrate such as a copper foil substrate, but the present disclosure is not limited to this. Copper foil substrate is used as an illustration in an embodiment. Metal materials containing copper 20a are provided on both sides of the substrate.

Figure 2B:
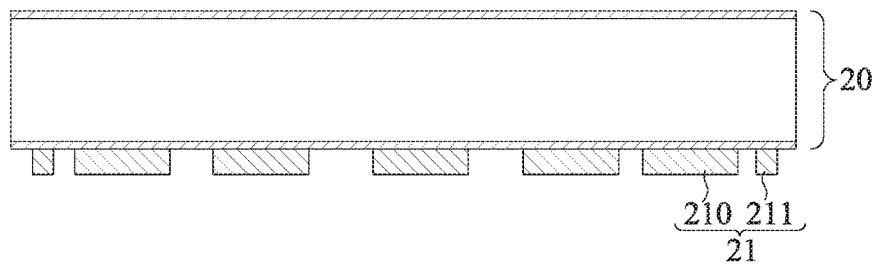

As shown in FIG. 2B, a first wiring layer 21 is formed on the base 20 by a patterning process.

In an embodiment, the first wiring layer 21 includes a plurality of conductive pads 210 and a plurality of conductive wires 211.

Figure 2C:
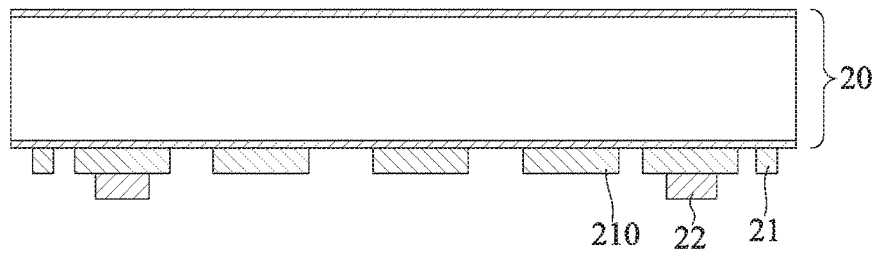

As shown in FIG. 2C, a plurality of conductive posts 22 are electroplated on the conductive pads 210 of the first wiring layer 21 by a patterning process.

In an embodiment, the conductive posts 22 are in contact and electrically connected with the respective conductive pads 210 of the first wiring layer 21.

Figure 2D:
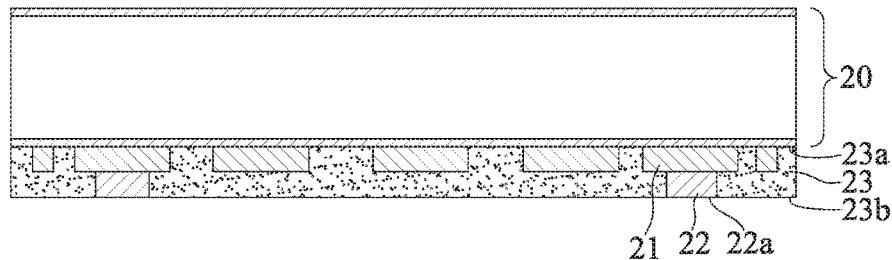

As shown in FIG. 2D, an insulating layer 23 is formed on the base 20. The insulating layer 23 has a first surface 23a and a second surface 23b opposite to each other. The insulating layer 23 is combined with the base 20 through its first surface 23a, and the conductive posts 22 are exposed from the second surface 23b of the insulating layer 23, wherein the end faces 22a of the conductive posts 22 are flush with the second surface 23b of the insulating layer 23.

In an embodiment, the insulating layer 23 can be formed on the base 20 by molding, coating or lamination, for example. The insulating layer 23 may be made of a dielectric material, such as epoxy resin. The epoxy resin may further include a molding compound or a primer, such as an epoxy molding compound (EMC). The epoxy molding compound may contain fillers. The content of the filler is between 70 to 90 wt %.

Figure 2E:
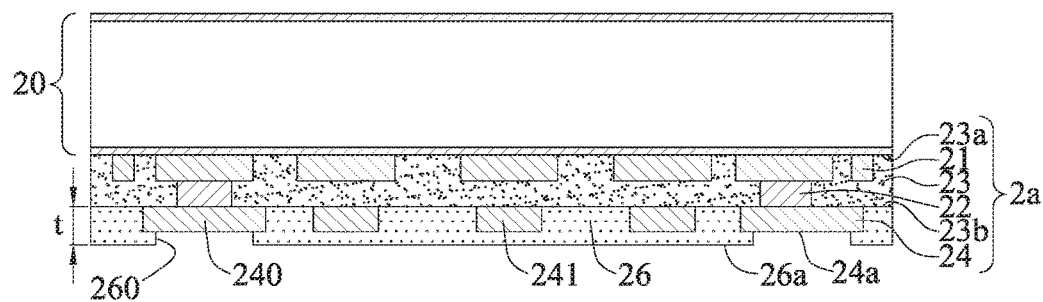

As shown in FIG. 2E, a second wiring layer 24 is formed on the second surface 23b of the insulating layer 23 and the conductive posts 22, such that the first wiring layer 21, the conductive posts 22 and the second wiring layer 24 together are used as a wiring portion. The insulating layer 23 and the wiring portion form the substrate body 2a. Then, an insulating protection layer 26 is formed on the second surface 23b of the insulating layer 23 of the substrate body, and a portion of the second wiring layer 24 of the substrate body 2a is exposed therefrom.

In an embodiment, the second wiring layer 24 includes a plurality of ball pads 240 for combining with solder balls (not shown) and a plurality of conductive wires 241 connected with the ball pads 240. The ball pads 240 are exposed from the insulating protection layer 26, wherein top surfaces 24a of the ball pads 240 of the second wiring layer 24 are lower than a surface 26a of the insulating protection layer 26. For example, a plurality of openings 260 corresponding to the locations of the ball pads 240 are provided in the insulating protection layer 26, such that the ball pads 240 are exposed from the openings 260. However, this embodiment is not limited as such. In other embodiments, as shown in FIG. 2F-1, for example, the top surfaces 24a and side faces 24c of the ball pads 240 of the second wiring layer 24 are completely exposed in the openings 261 of the insulating protection layer 26.

Furthermore, the insulating protection layer 26 is a cover layer with a thickness t of about 25 μm. It is made of polyimide (PI) or epoxy resin. Aluminum hydroxide (Al(OH)$_3$) and a phosphorus compound are added in the PI (or the epoxy resin) to form an insulating protection layer 26 having good toughness or flexibility. The phosphorus compound contains phosphorus in the range of 10000 and 30000 ppm.

Figure 2F:
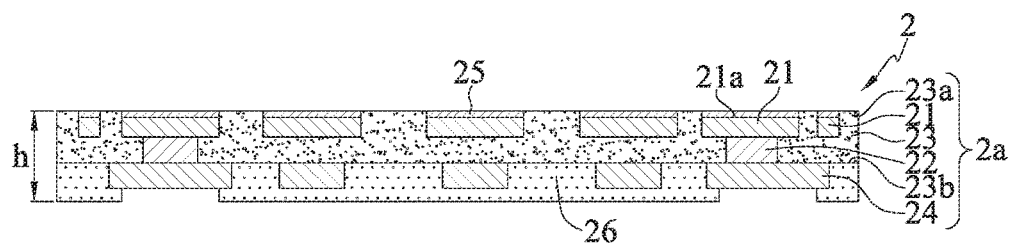
Figures 1, 2F:
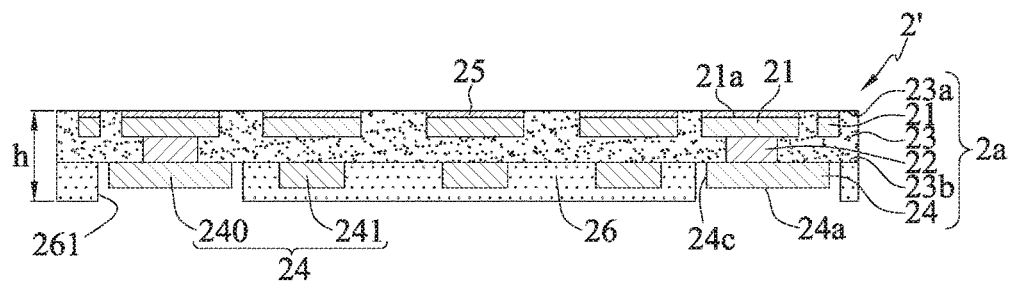

As shown in FIG. 2F, the base 20 is completely removed, such that a top surface 21a of the first wiring layer 21 is exposed from the first surface 23a of the insulating layer 23, and the top surface 21a of the first wiring layer 21 is lower than the first surface 23a of the insulating layer 23.

In an embodiment, the metal material 20a is removed by etching, and the top surface 21a of the first wiring layer 21 is also slightly etched and is slightly lower than the first surface 23a of the insulating layer 23.

Moreover, a surface treatment layer 25 is formed as required on the top surface 21a of the first wiring layer 21 (or the exposed surface of the second wiring layer 24). The surface of the surface treatment layer 25 can be higher than, lower than or flush with the first surface 23a of the insulating layer 23 (or the surface of the insulating protection layer 26). For example, the surface treatment layer 25 can be made of copper surface protection agent, OSP, electroplated nickel palladium gold, nickel palladium gold, electroplated nickel gold, plated tin, plated silver or a combination of the above.

The manufacturing method according to the present disclosure above increases toughness by incorporating aluminum hydroxide (Al(OH)$_3$) and a phosphorus compound into the insulating protection layer 26, so that the insulating protection layer 26 can be a thin film made of a tacky material with good structural strength without the need for a tape. Even when the thickness h of the interposer substrate 2 is small (e.g., thickness h is less than 180 μm), the insulating protection layer 26 having the phosphorus compound can still be able to provide the toughness the interposer substrate 2 needs. As a result, when shrinkage stress or structural asymmetry occurs, substrate warpage can be prevented. Compared to the prior art, the interposer substrate 2 according to the present disclosure satisfies both the need for thinning and the requirement for stress variations.

Moreover, since the insulating protection layer 26 having the phosphorus compound has good toughness, its coefficient of thermal expansion (CTE) is much greater than the CTE of the insulating layer 23. Therefore, by adjusting the CTE of the insulating protection layer 26, the warpage of the interposer substrate 2 can be alleviated.

Figure 2G:
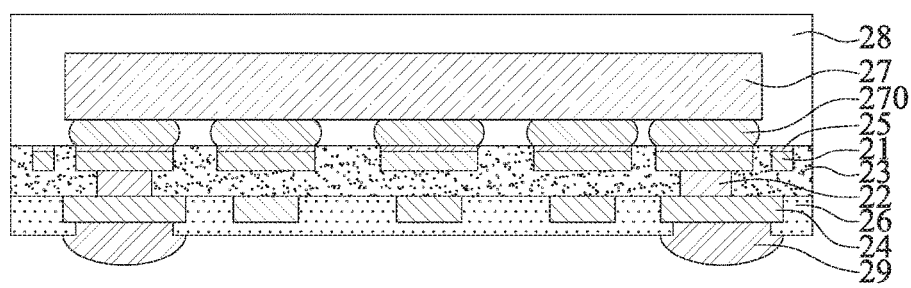
FIG. 2G is a cross-sectional diagram depicting a subsequent step after FIG. 2F.

In addition, in a subsequent manufacturing step, as shown in FIG. 2G, an electronic element 27 can be provided on the conductive pads 210 of the first wiring layer 21 of the substrate body 2a, and an encapsulation layer 28 is formed and encapsulating the electronic element 27. Alternatively, conductive elements 29 (e.g., solder balls) are provided on the second wiring layer 24 of the substrate body 2a for connecting with an external electronic device, such as a circuit board, a package, a chip or a package substrate.

The electronic element 27 can be an active element, a passive element or a combination of both. The active element may be, for example, a semiconductor chip, and the passive element may be, for example, a resistor, a capacitor or an inductor. For example, the electronic element 27 is disposed on and electrically connected with the first wiring layer 21 in a flip-chip manner via a plurality of conductive bumps 270 (e.g., soldering materials). Alternatively, the electronic element 27 can be electrically connected with the first wiring layer 21 through a plurality of conductive wires (not shown) by wire bonding. Alternatively, the electronic element 27 can be in direct contact with the first wiring layer 21. However, the electrical connections between the electronic element 27 and the first wiring layer 21 are not limited to those described above.

The encapsulation layer 28 can be a thin film suitable for the lamination process, an encapsulant for the molding process or a gel-type material suitable for the printing process. The encapsulation layer 28 can be formed from polyimide (PI) a dry film, epoxy resin or a packaging material. However, the material of and the method of forming the encapsulation layer 28 are not limited to those described above.

Figure 3A:
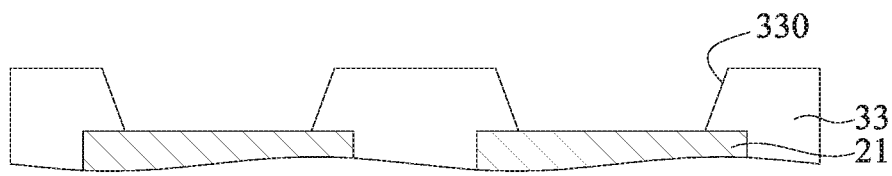
FIGS. 3A to 3C are cross-sectional diagrams illustrating a method for manufacturing an interposer substrate in accordance with a second embodiment of the present disclosure.
Figure 3B:
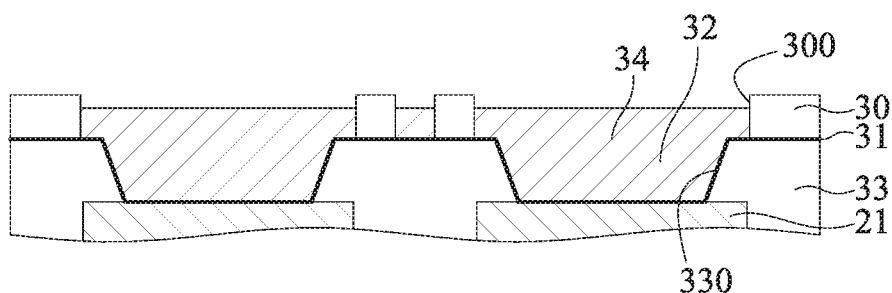
Figure 3C:
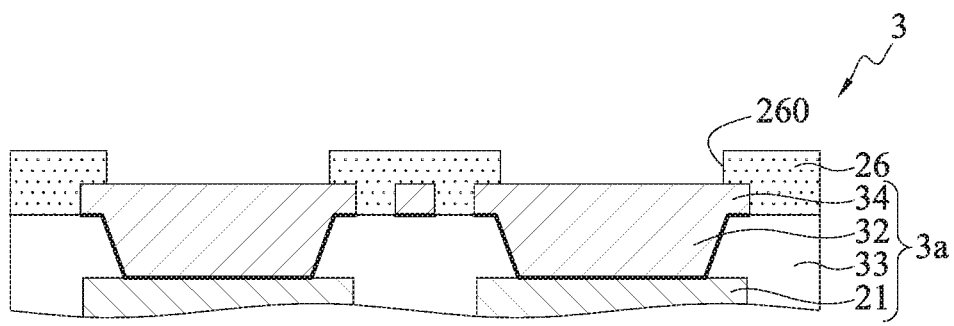

FIGS. 3A to 3C are cross-sectional diagrams illustrating a method for manufacturing an interposer substrate 3 in accordance with a second embodiment of the present disclosure. The second embodiment is different from the first embodiment in the manufacturing process of the substrate body 2a, and the rest of the process is similar or the same. Thus, only the differences are described below, and the same or similar features are omitted for conciseness.

As shown in FIG. 3A, after the step shown in FIG. 2B, an insulating layer 33 is formed on the base (not shown) and the first wiring layer 21. A plurality of blind vias 330 are formed to expose portions of the first wiring layer 21.

In an embodiment, the insulating layer 33 is made of a dielectric material, such as, for example, polybenzoxazole (PBO), polyimide (PI), or prepreg (PP).

As shown in FIG. 3B, a conductive layer 31 is formed on the insulating layer 33 and the blind vias 330. A resist layer 30 is further formed on the conductive layer 31. A plurality of openings 300 are formed in the resist layer 30, such that the conductive layer 31 in the blind vias 330 and a portion of the conductive layer 31 on the insulating layer 33 adjacent to the blind vias 330 are exposed from the openings 300. Thereafter, a second wiring layer 34 and conductive posts 32 are electroplated in the openings 300 using the conductive layer 31, such that the second wiring layer 34 and the conductive posts 32 are integrally formed. The conductive posts 32 are disposed in the blind vias 330 to electrically connect with the conductive layer 31.

As shown in FIG. 3C, the resist layer 30 and the conductive layer 31 underneath the resist layer 30 are removed to form a substrate body 3a. The insulating protection layer 26 is then formed on the insulating layer 33 and the second wiring layer 34 of the substrate body 3a. The insulating protection layer 26 includes a plurality of openings 260 to expose portions of the second wiring layer 34.

It should be understood that in other embodiments, the wiring portion of the substrate body 2a or 3a can include more wiring layers, and the number of the wiring layers is not limited to two as described in the above embodiments (i.e., the first wiring layer 21 and the second wiring layer 24 or 34).

The present disclosure further provides an interposer substrate 2 or 3, which includes: a substrate body 2a or 3a and an insulating protection layer 26 formed on the substrate body 2a or 3a.

The substrate body 2a or 3a includes at least one insulating layer 23 or 33 and a wiring portion combined with the insulating layer 23 or 33.

The insulating protection layer 26 includes a phosphorous compound containing phosphorous in the range of 10000 and 30000 ppm.

In an embodiment, the insulating layer 23 or 33 is made of a molding compound or a primer.

In an embodiment, the wiring portion includes a first wiring layer 21 and a second wiring layer 24 or 34 formed on the insulating layer 23 or 33. Furthermore, the wiring portion further includes conductive posts 22 or 34 disposed in the insulating layer 23 or 33 and electrically connected to the first wiring layer 21 and the second wiring layer 24 or 34.

In an embodiment, the CTE of the insulating protection layer 26 is greater than the CTE of the insulating layer 23 or 33.

In an embodiment, the thickness h of the interposer substrate 2 or 3 (or the total thickness of the substrate body 2a or 3a and the insulating protection layer 26) is less than or equal to 180 μm.

In conclusion, the interposer substrate and the method for manufacturing the same according to the present disclosure increase toughness by incorporating a phosphorus compound into the insulating protection layer, so that when the thickness of the interposer substrate is small, the insulating protection layer having the phosphorus compound can provide toughness the interposer substrate needs. As a result, the interposer substrate according to the present disclosure satisfies both the need for thinning and the requirement for stress variations.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:
1. An interposer substrate, comprising:
  a substrate body having a first surface and a second surface opposite to the first surface and including at least one insulating layer and a wiring portion combined with the insulating layer, the wiring portion including a wiring layer formed on the insulating layer and a plurality of conductive posts disposed in the insulating layer and electrically connected to the wiring layer; and an insulating protection layer formed on the second surface and free from being formed on the first surface of the substrate body and including a phosphorous compound, wherein the insulating protection layer has a coefficient of thermal expansion (CTE) greater than the insulating layer.

2. The interposer substrate of claim 1, wherein the insulating layer is made of a molding compound or a primer.

3. The interposer substrate of claim 1, wherein the phosphorous compound contains phosphorous in a range of from 10000 ppm to 30000 ppm.

4. The interposer substrate of claim 1, wherein the substrate body and the insulating protection layer have a total thickness of less than or equal to 180 µm.

5. A method for manufacturing an interposer substrate, comprising:

providing a substrate body having a first surface and a second surface opposite to the first surface and including at least one insulating layer and a wiring portion combined with the insulating layer, the wiring portion including a wiring layer formed on the insulating layer and a plurality of conductive posts disposed in the insulating layer and electrically connected to the wiring layer; and forming on the second surface and free from forming on the first surface of the substrate body an insulating protection layer including a phosphorous compound, wherein the insulating protection layer has a coefficient of thermal expansion (CTE) greater than the insulating layer.

6. The method of claim 5, wherein the insulating layer is made a molding compound or a primer.

7. The method of claim 5, wherein the phosphorous compound contains phosphorous in a range of from 10000 ppm to 30000 ppm.

8. The method of claim 5, wherein the substrate body and the insulating protection layer have a total thickness of less than or equal to 180 µm.

* * * * *